(12) United States Patent
Hsin et al.

(10) Patent No.: US 8,619,361 B2
(45) Date of Patent: Dec. 31, 2013

(54) DIRECT DERIVATIVE FEEDFORWARD VIBRATION COMPENSATION SYSTEM

(75) Inventors: Yi-Ping Hsin, Dublin, CA (US);
Susumu Isago, Tokyo (JP); Kazuo Masaki, Saitama (JP); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 385 days.

(21) Appl. No.: 12/750,713

(22) Filed: Mar. 31, 2010

(65) Prior Publication Data

US 2011/0242660 A1 Oct. 6, 2011

(51) Int. Cl.
*G02B 27/64* (2006.01)
*A61N 5/00* (2006.01)
*G03F 7/20* (2006.01)
*B82Y 10/00* (2011.01)

(52) U.S. Cl.
CPC .......... *G03F 7/70358* (2013.01); *G02B 27/646* (2013.01); *B82Y 10/00* (2013.01)
USPC ........... 359/557; 359/554; 355/53; 250/492.2

(58) Field of Classification Search
USPC .......................................... 359/554–557, 896
See application file for complete search history.

(56) References Cited

U.S. PATENT DOCUMENTS

| | | | |
|---|---|---|---|
| 6,320,345 B1 * | 11/2001 | Yuan et al. | 318/569 |
| 6,412,329 B1 * | 7/2002 | Nai | 73/1.79 |
| 6,420,716 B1 * | 7/2002 | Cox et al. | 250/492.2 |
| 6,507,165 B2 * | 1/2003 | Kato et al. | 318/611 |
| 6,762,902 B2 * | 7/2004 | Chew | 360/78.04 |
| 6,879,375 B1 * | 4/2005 | Kayama | 355/53 |
| 2003/0197845 A1* | 10/2003 | Morisada | 355/53 |
| 2009/0224444 A1* | 9/2009 | Mayama et al. | 267/118 |

* cited by examiner

*Primary Examiner* — Thong Nguyen (57) ABSTRACT

Methods and apparatus for providing vibration compensation using position measurements are disclosed. According to one aspect of the present invention, a method of compensating for vibrations of an object includes obtaining a plurality of position measurements associated with the object. The method also includes processing the plurality of position measurements to determine a derivative acceleration, and determining a compensatory force to counteract the vibrations of the object. Determining the compensatory force includes using the derivative acceleration. Finally, the method includes applying the compensatory force to the object.

20 Claims, 10 Drawing Sheets

FIG. 10 ion may have an adverse impact on the semiconductor wafers formed using the photolithography system. As a result, many photolithography systems detect vibrations, and provide compensation for the vibrations.

DIRECT DERIVATIVE FEEDFORWARD VIBRATION COMPENSATION SYSTEM

BACKGROUND OF THE INVENTION

1. Field of the Invention

The present invention relates generally to equipment used in photolithography systems. More particularly, the present invention relates to a system which detects acceleration of a lens system and compensates for vibrations in the lens system substantially without utilizing an accelerometer.

2. Description of the Related Art

In many photolithography systems, vibrations have an adverse effect. For example, if vibrations of a lens barrel of a projection lens arrangement of a photolithography system cause a projection lens to vibrate, images projected by the projection lens arrangement may be distorted. Distortion in projected images may have an adverse impact on the semiconductor wafers formed using the photolithography system. As a result, many photolithography systems detect vibrations, and provide compensation for the vibrations.

Typically, in order to detect vibrations, accelerometers are provided. By way of example, when a projection lens arrangement is subject to vibrations, an accelerometer or similar sensor may generally be placed on an active lens mount of the projection lens arrangement. While the accelerometer may accurately detect vibrations, locating the accelerometer on the active lens mount may be problematic. Adding additional hardware, i.e., a sensor such as an accelerometer, to a projection lens arrangement may be inconvenient and/or uneconomical. In addition, sensors such as accelerometers have a time-delayed response and, further often have noise issues.

SUMMARY OF THE INVENTION

The present invention pertains to a control system which detects and compensates for vibrations without utilizing an accelerometer.

According to one aspect of the present invention, a method of compensating for vibrations of an object includes obtaining a plurality of position measurements associated with the object. The method also includes processing the plurality of position measurements to determine a derivative acceleration, and determining a compensatory force to counteract the vibrations of the object. Determining the compensatory force includes using the derivative acceleration. Finally, the method includes applying the compensatory force to the object.

In one embodiment, processing the plurality of position measurements to determine the derivative acceleration includes deriving at least one velocity from the plurality of position measurements and deriving the derivative acceleration from the at least one velocity. In such an embodiment the velocity is derived by a first derivative controller and the derivative acceleration is derived by a second derivative controller.

According to another aspect of the present invention, an apparatus for compensating for vibrations of an object includes a position sensing arrangement, a derivative control arrangement, and a compensation arrangement. The position sensing arrangement is configured to measure at least a first position of the object at a first time, a second position of the object at a second time, and a third position of the object at a third time. The derivative control arrangement is configured to derive at least a first derivative velocity using the first position, the second position and the third position. The derivative control arrangement is also configured to derive at least a first derivative acceleration using at least the first derivative velocity. The compensation arrangement determines a compensation force to compensate for the vibrations of the object using at least the first derivative acceleration, and causes the compensation force to be applied to the object.

In accordance with still another aspect of the present invention, an apparatus includes an object that is subjected to vibrations, a driver configured to apply a force to the object, a position sensing arrangement, and a control arrangement. The position sensing arrangement measures positions of the object at different times. The positions of the object include a first position, a second position, and a third position. The control arrangement determines the force to be applied to the object to compensate for the vibrations by processing the positions.

Other aspects of the present invention will become apparent from the following detailed description taken in conjunction with the accompanying drawings which illustrate, by way of example, the principles of some embodiments of the present invention.

BRIEF DESCRIPTION OF THE DRAWINGS

The invention will be readily understood by the following detailed description in conjunction with the accompanying drawings, in which.

DETAILED DESCRIPTION OF THE INVENTION

Example embodiments of the present invention are discussed below with reference to the various figures. However, those skilled in the art will readily appreciate that the detailed description given herein with respect to these figures is for explanatory purposes, as the invention extends beyond these embodiments.

Vibrations may have an adverse effect on sensitive systems such as photolithography systems. For example, if a projection lens arrangement of a photolithography system is subjected to vibrations, the integrity of semiconductor wafers formed using the photolithography system may be compromised. Thus, it is critical to dampen or otherwise counteract vibrations within a photolithography system. Accelerometers may be used to provide information that is used to determine the compensatory forces. However, accelerometers have a hardware cost and have associated sensor noise.

Many systems, e.g., projection lens systems, have position sensors configured to measure positions of moving elements at different times. Position measurements obtained over time may be used to derive velocities and accelerations associated with the moving elements. Such velocities and accelerations may be used as a part of a vibration compensation system, e.g., a direct derivative feedforward vibration compensation system, to essentially calculate a force that may be applied to an element in order counteract or to otherwise compensate for vibrations affecting the element.

By effectively constructing acceleration and/or velocity signals from position signals, the acceleration and/or velocity of an object such as a lens or a lens barrel may be determined from information provided by a position sensor. The acceleration and/or velocity are constructed, e.g., derived, from position measurements. Hence, additional sensors such as accelerometers may not be necessary in order to detect and to compensate for vibrations of an object. Thus, the hardware costs associated with additional sensors, in addition to additional noise introduced by the additional sensors, may be substantially avoided.

Figure 1A:
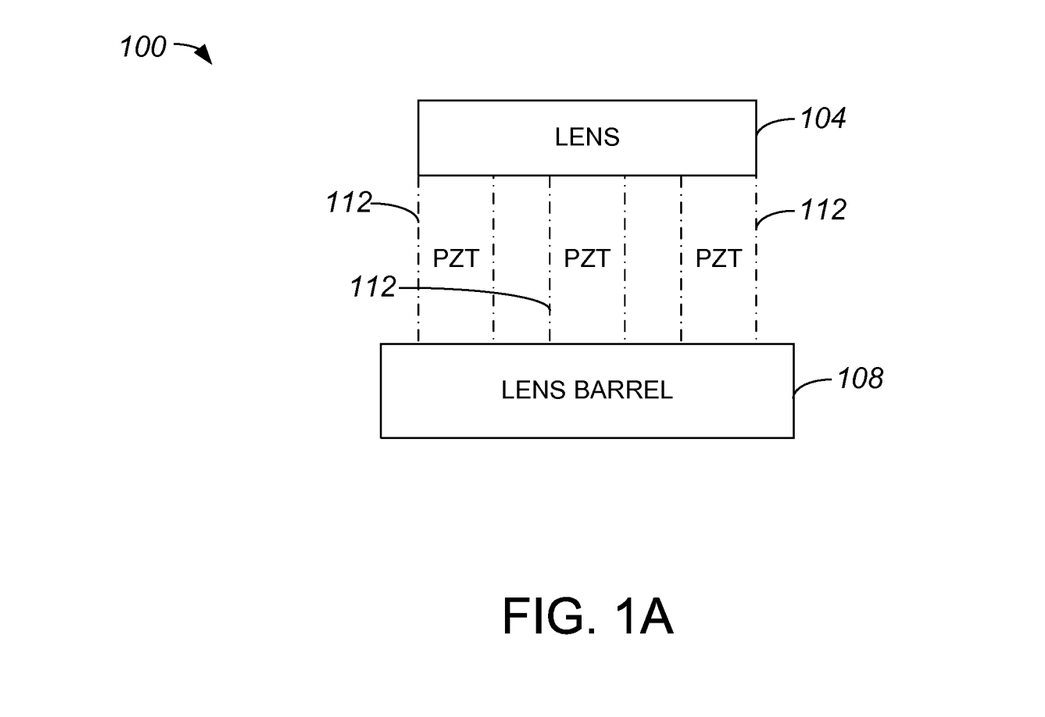
FIG. 1A is a block diagram representation of a lens mount apparatus in accordance with an embodiment of the present invention.

Referring initially to FIG. 1A, a lens mount apparatus subject to vibrations that are to be compensated for will be described in accordance with an embodiment of the present invention. A lens mount apparatus 100 includes a lens 104, and a lens barrel 108. Lens 104 and lens barrel 108 are coupled through a plurality of piezoelectric actuators (PZTs) 112. PZTs 112 support lens 104, and provide lens control that allows lens 104 to be positioned as desired. It should be appreciated that there may be relative motion between lens 104 and lens barrel 108, as lens 104 may move a different amount than lens barrel 108.

Figure 1B:
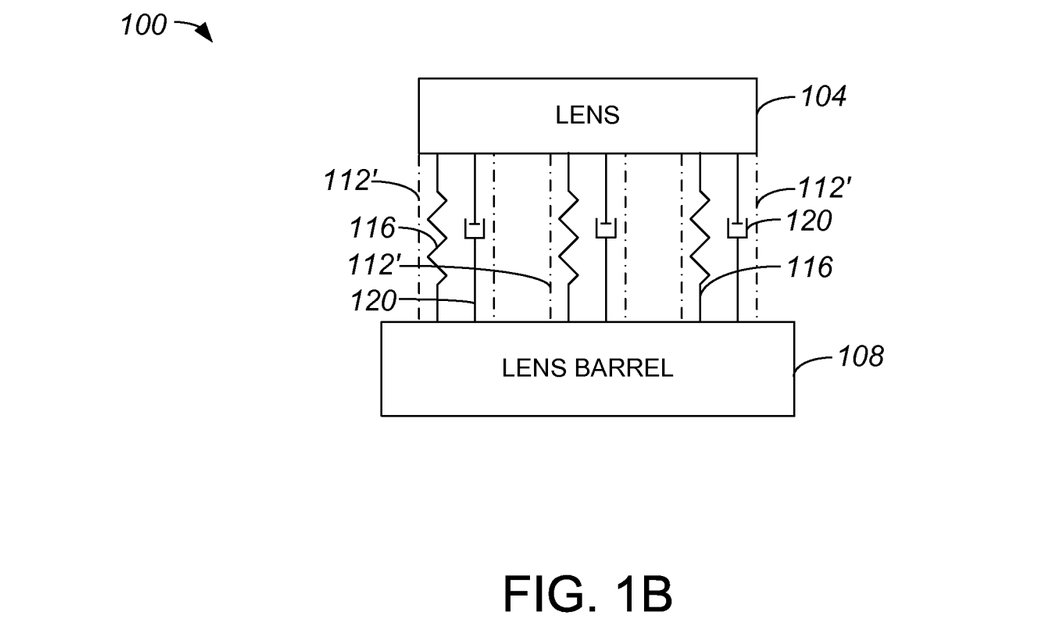
FIG. 1B is a block diagram representation of a lens mount apparatus with piezoelectric actuators, e.g., piezoelectric actuators 112 of FIG. 1A, modeled as springs and dampers in accordance with an embodiment of the present invention.

PZTs 112 may be modeled as springs and dampers. FIG. 1B is a block diagram representation of lens mount apparatus 100 with PZTs modeled as springs and dampers in accordance with an embodiment of the present invention. Each PZT 112' includes a spring 116 and a damper 120. Springs 116 and dampers 120 may effectively be adjusted such that any vibrations which may be transmitted from lens barrel 108 to lens 104 may be dampened and substantially eliminated. Using position measurements relating to lens 104 that are obtained over time, an acceleration of lens 104 may be calculated or derived. The acceleration of lens 104 may be used to determine the amount of damping, e.g., damping that is to be provided PZTs 112', to compensate for vibrations imparted by lens barrel 108 on lens 104.

Figure 2:
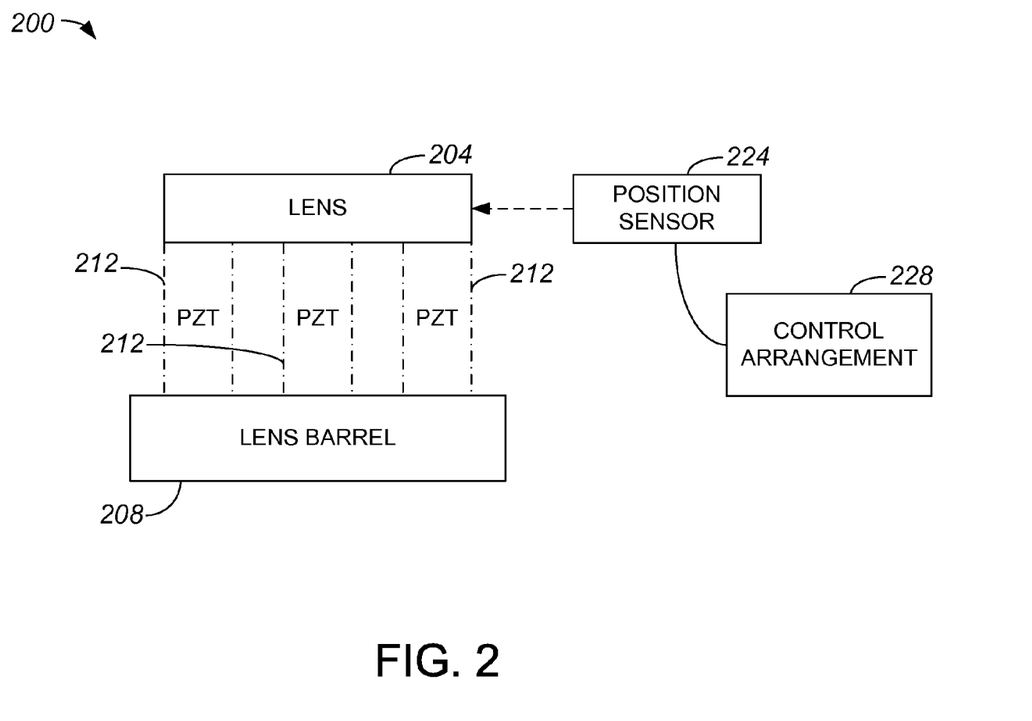
FIG. 2 is a diagrammatic representation of a system in which acceleration associated with an active lens mount apparatus is detected substantially without an accelerometer in accordance with an embodiment of the present invention.

FIG. 2 is a diagrammatic representation of a system in which acceleration associated with an active lens mount apparatus is detected substantially without an accelerometer in accordance with an embodiment of the present invention. A system 200 includes a lens barrel 208 that is substantially coupled to a lens 204 through PZTs 212. A position sensor 224 is arranged to measure the position of lens 204, and may determine a displacement of lens 204 relative to lens barrel 208. That is, position sensor 224 may be configured to essentially measure a position of lens 204 relative to a substantially fixed reference point and/or may be configured to measure a position of lens 204 relative to lens barrel 208.

Vibrations in lens 204 may be transmitted by lens barrel 208 through PZTs 212 such that the position of lens 204 changes. In one embodiment, position sensor 224 effectively produces a position signal that indicates the location if lens 204 at different points in time. Position sensor 224 provides the position signal to a control arrangement 228. Control arrangement 228 is configured to process the position to derive or otherwise obtain at least one velocity associated with lens 204 and at least one acceleration associated with lens 204. By way of example, control arrangement 228 may generate a velocity signal that corresponds to lens 204 and an acceleration signal that corresponds to lens 204. Such signals may be used by control arrangement 228 to determine a force to be applied to lens 204 to substantially counteract vibrations in lens 204 that are transmitted by lens barrel 208. Such a force may be applied through adjusting command provided to PZTs 212.

Figure 3:
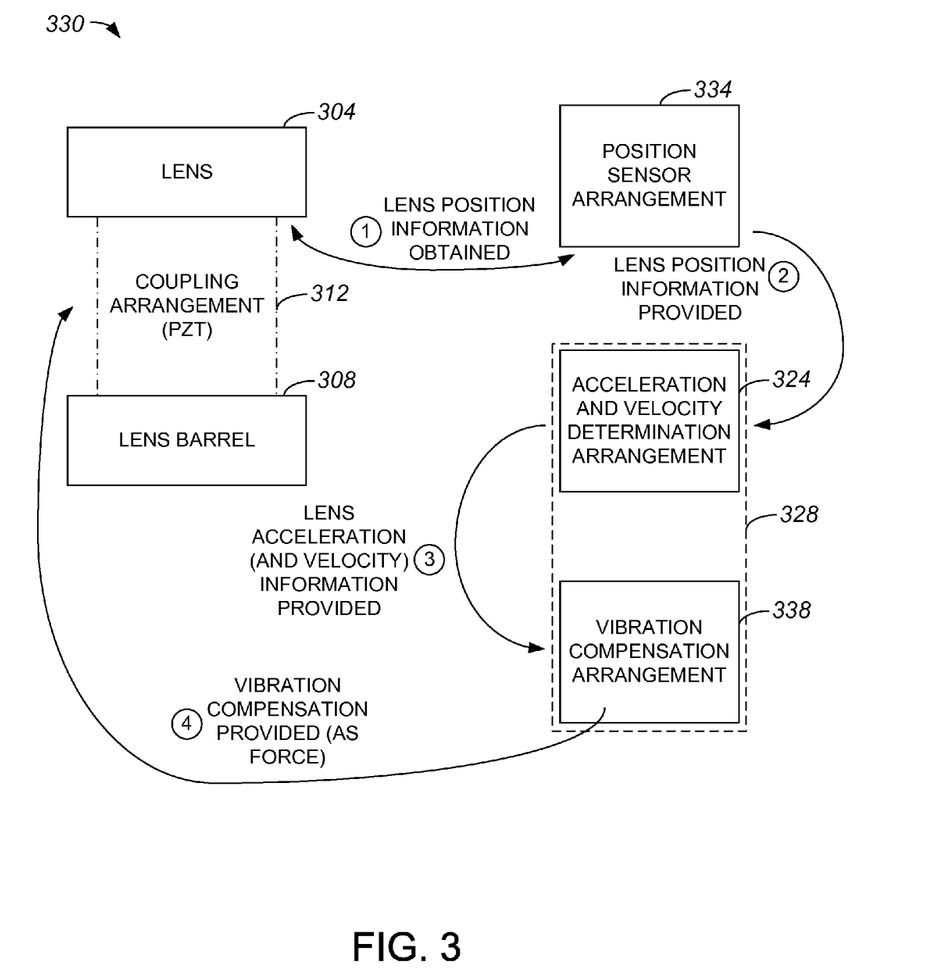
FIG. 3 is a block diagram representation of a system in which vibration compensation is provided based on position information relating to a lens in accordance with an embodiment of the present invention.

With reference to FIG. 3, a system in which vibration compensation is provided based on the position of a lens at different times will be described in accordance with an embodiment of the present invention. A system 330, e.g., a projection lens system of a photolithography apparatus, generally includes a lens barrel 308 that is effectively coupled to a lens 304 through a coupling arrangement 312. Coupling arrangement 312 may be, but is not limited to being, a plurality of PZTs. System 330 also includes a position sensor arrangement 334 that is arranged to measure the position of lens 304, and a control or filter arrangement 328. Control arrangement 328 includes an acceleration and velocity determination arrangement 324 and a vibration compensation arrangement 338.

Position sensor arrangement 334 obtains position information relating to lens 304. For example, position sensor arrangement 334 may obtain measurements associated with the movement of lens 304. Position sensor arrangement 334, upon obtaining position information relating to lens 304, may provide such position information to control arrangement 328. In one embodiment, the lens position information is provided to acceleration and velocity determination arrangement 324. Acceleration and velocity determination arrangement 324 derives velocity and acceleration signals from lens position information. In one embodiment, acceleration and velocity determination arrangement 324 may essentially be a direct derivative feedforward controller. As such, control arrangement 328 may effectively be a direct derivative feedforward vibration compensation system.

The velocity and acceleration signals derived by acceleration and velocity determination arrangement 324 are generally provided to vibration compensation arrangement 338. Vibration compensation arrangement 338 processes the velocity and acceleration signals to determine how to compensate for vibrations which have an adverse effect on lens 304. Once vibration compensation arrangement 338 determines how much force to apply within system 330 to compensate for vibrations which have an adverse effect on lens 304. The force is typically applied to lens 304 through the use of a driver or an actuator, e.g., a PZT included in coupling arrangement 312. In other words, vibration compensation arrangement 338 effectively controls the operation of drivers or actuators by controlling at least the amount of force to be applied to lens 304 by the drivers or actuators.

Figure 4:
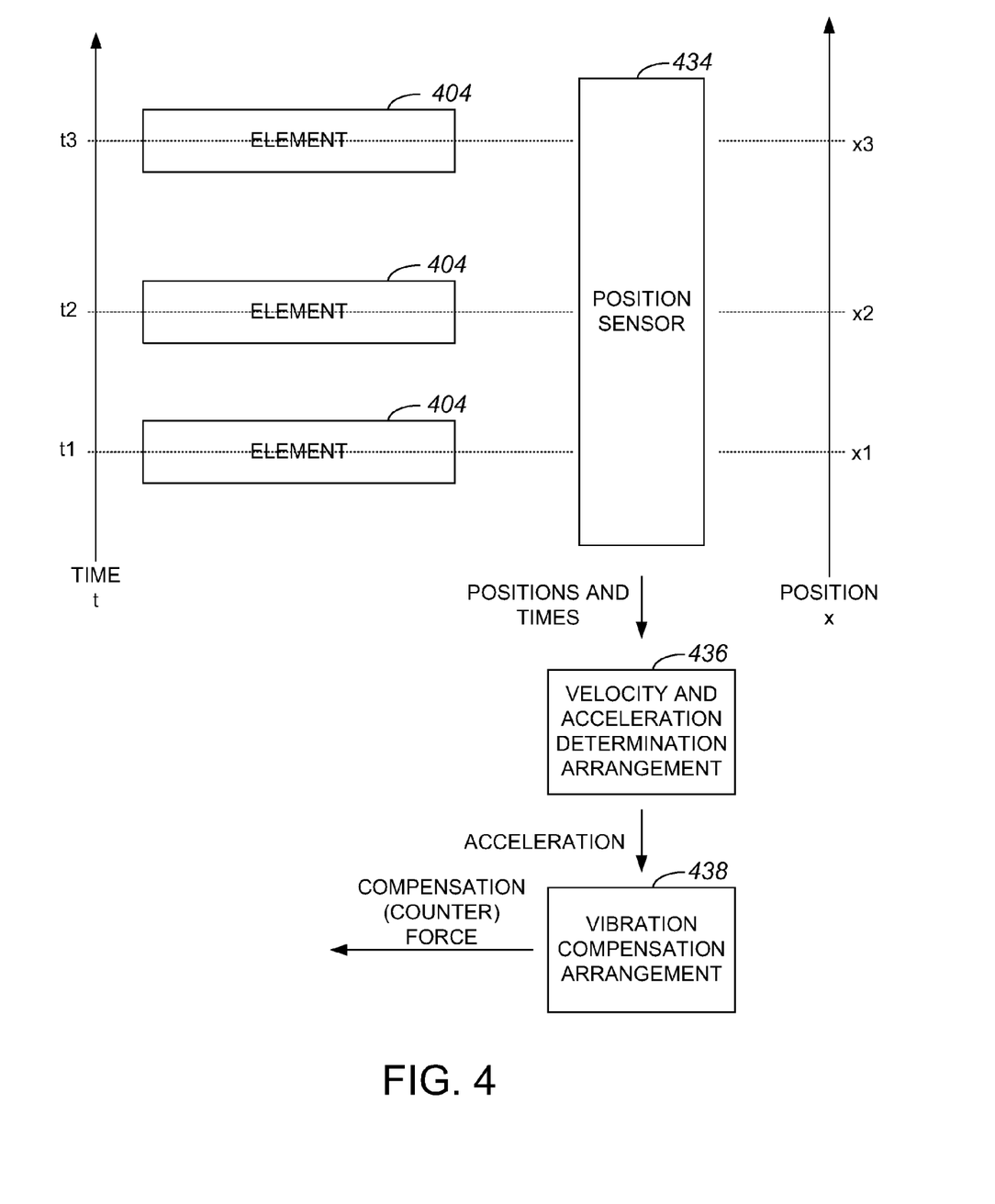
FIG. 4 is a diagrammatic representation of an element that is accelerating in accordance with an embodiment of the present invention.

Generally, a direct derivative feedforward vibration compensation system is not limited for use in compensating for vibrations, e.g., scanning vibrations, that are experienced by a lens of a projection lens system. A direct derivative feedforward vibration compensation system may be utilized with respect to any element or object that is subject to unwanted vibrations and for which accelerations may be detected based on position measurements. FIG. 4 is a diagrammatic representation of an element, e.g., a lens, that is accelerating in accordance with an embodiment of the present invention. At a time t1, an element 404 is located at a position x1. A position sensor 434 determines that element 404 is at position x1 at time t1, and provides a position measurement signal to velocity and acceleration determination agreement 436.

In the embodiment as shown, at a time t2, element 404 is at position x2, and at time t3, element 404 is at position x3. Position sensor 434 effectively senses the positions of element 404, and provides the positions to velocity and acceleration determination agreement 436 in a position measurement signal. As will be appreciated by those skilled in the art, although the position of element 404 is illustrated as changing in a positive x-direction, element 404 is not limited to moving in a positive x-direction. By way of example, element 404 may alternate between moving in a positive x-direction and a negative x-direction.

Velocity and acceleration determination arrangement 436 derives velocities and accelerations using the position measurement signal. At least the acceleration is provided to a vibration compensation arrangement 438, which then determines a compensation force that is suitable for compensating for vibrations experienced by element 404. The compensation force may be applied to element, as for example through a driver or an actuator.

Figure 5:
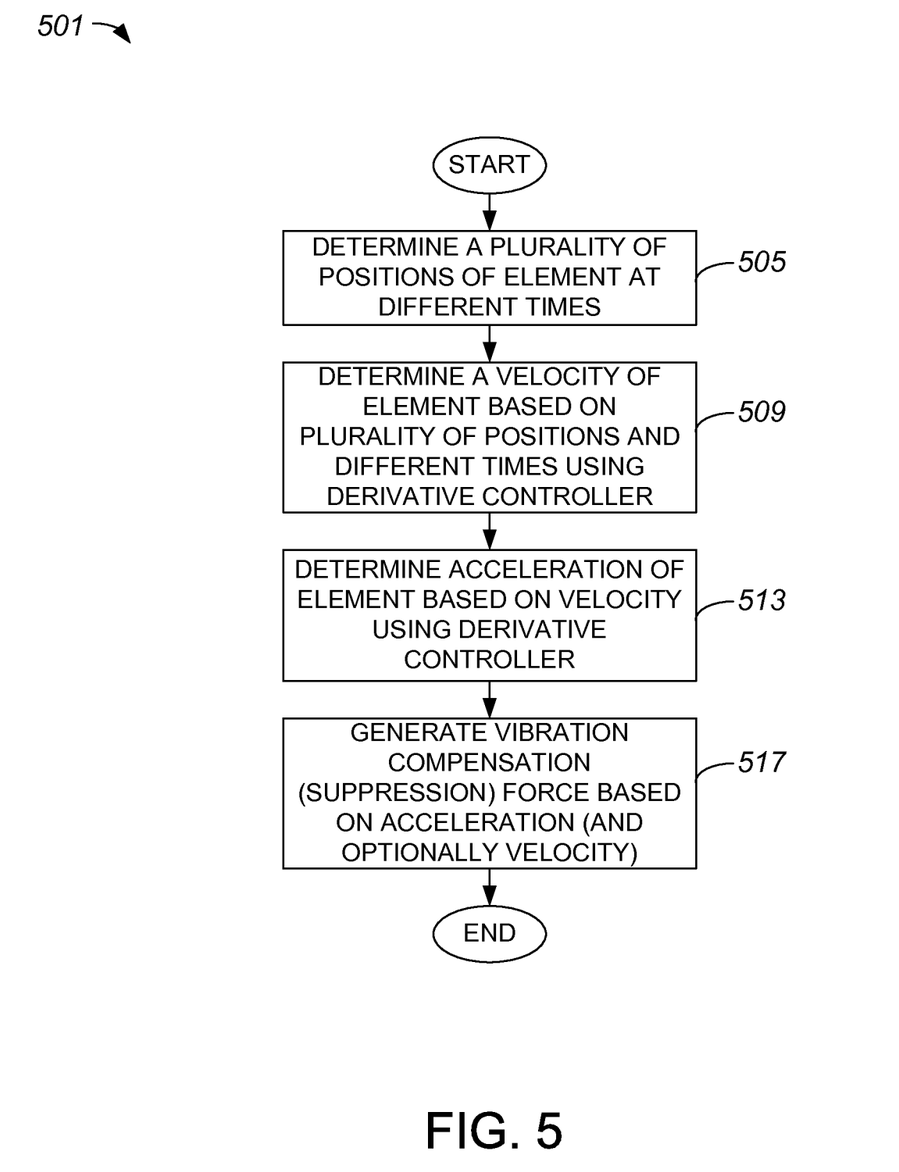
FIG. 5 is a process flow diagram which illustrates a method of providing direct derivative feedforward vibration compensation in accordance with an embodiment of the present invention.

FIG. 5 is a process flow diagram which illustrates a method of providing direct derivative feedforward vibration compensation in accordance with an embodiment of the present invention. A method 501 of providing direct derivative feedforward vibration compensation begins at step 505 in which a plurality of positions of an element are determined for different times. In other words, the position or location of an element at different points in time is effectively identified. The identification of a position or location of an element may include, but is not limited to including, identifying a displacement of a particular part of the element relative to a control location. The plurality of positions may be determined using a position sensor that tracks the position of the element as the element moves with respect to at least one degree of freedom.

Once the plurality of positions of the element at different times is determined, the plurality of positions is used in step 509 to determine at least one velocity associated with the element. In one embodiment, a derivative controller may be used to substantially derive at least one velocity of the element using information relating to the position of the element at different times. After the velocity of the element is determined, the velocity is used in step 513 to determine an acceleration of the element. The acceleration may be determined by providing the velocity to a derivative controller configured to derive the acceleration from information including, but not limited to including, the velocity of the element.

In step 517, a vibration compensation, or suppression, force may be generated based on at least the acceleration of the element. The vibration compensation force may be generated to substantially damp, or otherwise compensate for, vibrations experienced by the element. It should be appreciated that in addition to using the acceleration of the element to determine a force to apply on the element to substantially compensate for vibrations, the velocity of the element may optionally be used in determining the force. In one embodiment, in order to provide substantially real-time, continuous vibration control, the steps associated method 501 may be repeated such that the vibration compensation force may be updated as necessary. However, in the embodiment as shown, once the vibration compensation force is generated, e.g., by a vibration compensation arrangement, the method of providing direct derivative feedforward vibration compensation is completed.

Figure 6A:
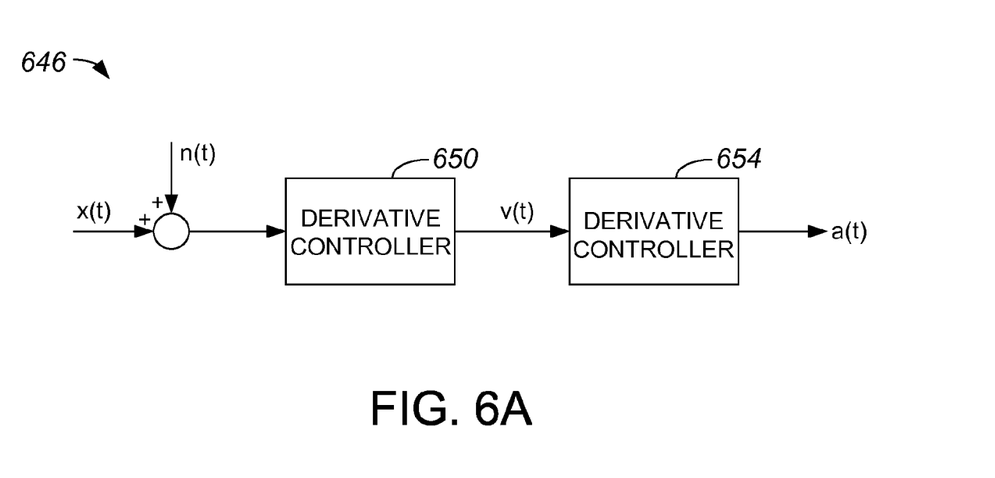
FIG. 6A is a representation of an overall derivative controller in accordance with an embodiment of the present invention.

As previously mentioned, velocities may be derived from position measurements taken over time using a derivative controller, and accelerations may be derived from velocities using a derivative controller. The overall derivative controller that is composed of the derivative controller used to derive velocities and the derivative controller used to derive accelerations used may vary widely. With reference to FIG. 6A, one overall derivative control arrangement that is suitable for use as a direct derivative feedforward controller will be described in accordance with an embodiment of the present invention. An overall derivative control arrangement 646 includes a first arrangement 650 and a second arrangement 654. In the described embodiment, first arrangement 650 and second arrangement 654 are derivative controllers that cooperate to provide direct derivative feedforward control.

A position measurement signal x(t) and a sensor noise signal n(t) are provided as inputs to first arrangement 650 from a position sensor (not shown). The position measurement signal x(t) may relate to the position of an object, e.g., a lens or a lens barrel. In the event that the position sensor (not shown) has a relatively insignificant amount of measurement noise, sensor noise signal n(t) may not be provided as an input to first arrangement 650. First arrangement 650 is configured to derive or construct a derivative velocity signal v(t) from position measurement signal x(t) and sensor noise signal n(t). Derivative velocity signal v(t) is provided as an input to second arrangement 654, which is configured to derive or construct a derivative acceleration signal a(t) from derivative velocity signal v(t).

Figure 6B:
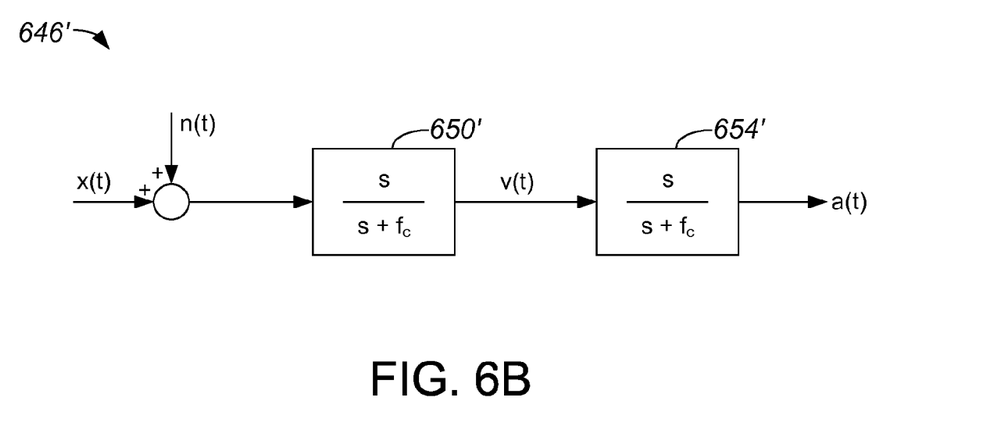
FIG. 6B is a representation of an overall derivative controller which includes limited bandwidth derivative controller components in accordance with an embodiment of the present invention.

Sensor noise signal n(t) is generally present, and is typically distributed over a relatively wide range of frequencies. As such, to compensate for sensor noise signal n(t), first arrangement 650 and second arrangement 654 may be limited bandwidth derivative controllers, as shown in FIG. 6B. An overall derivative control arrangement 646' may include limited bandwidth derivative controllers 650', 654' which each have derivative components 's' and an associated cut-off frequency $f_c$. The value of cut-off frequency $f_c$ may vary widely, and it should be appreciated that each limited bandwidth derivative controller 650', 654' may have different values for cut-off frequency $f_c$. In general, derivative action provided by limited bandwidth derivative controllers 650', 654' is most effective below the cut-off frequency $f_c$. The cut-off frequency $f_c$ may, in one embodiment, have a value of approximately one hundred Hertz (Hz). It should be appreciated, however, that the cut-off frequency $f_c$ is not limited to having a value of approximately one hundred Hz and may, instead, have a value that is greater than or less than approximately one hundred Hz. The cut-off frequency $f_c$ may be selected to be approximately equal to a peak frequency associated with the object plus an offset, e.g., an offset of approximately fifty Hz.

A feedforward signal, or a signal that is used to determine how much force is needed to compensate for vibrations of an object, includes a component relating to derivative acceleration signal a(t). The feedforward signal may also include a component relating to derivative velocity v(t). In one embodiment, the feedforward signal may be expressed as follows:

$$\text{Feedforward Signal} = k1*a(t) + k2*v(t)$$

where k1 and k2 are feedforward gains which may be tuned. While k1 and k2 may be constants, it should be appreciated that k1 and k2 may instead vary as functions of acceleration and velocity, respectively. In one embodiment, k1 and k2 may be tables and/or maps relating to acceleration and velocity.

Figure 7:
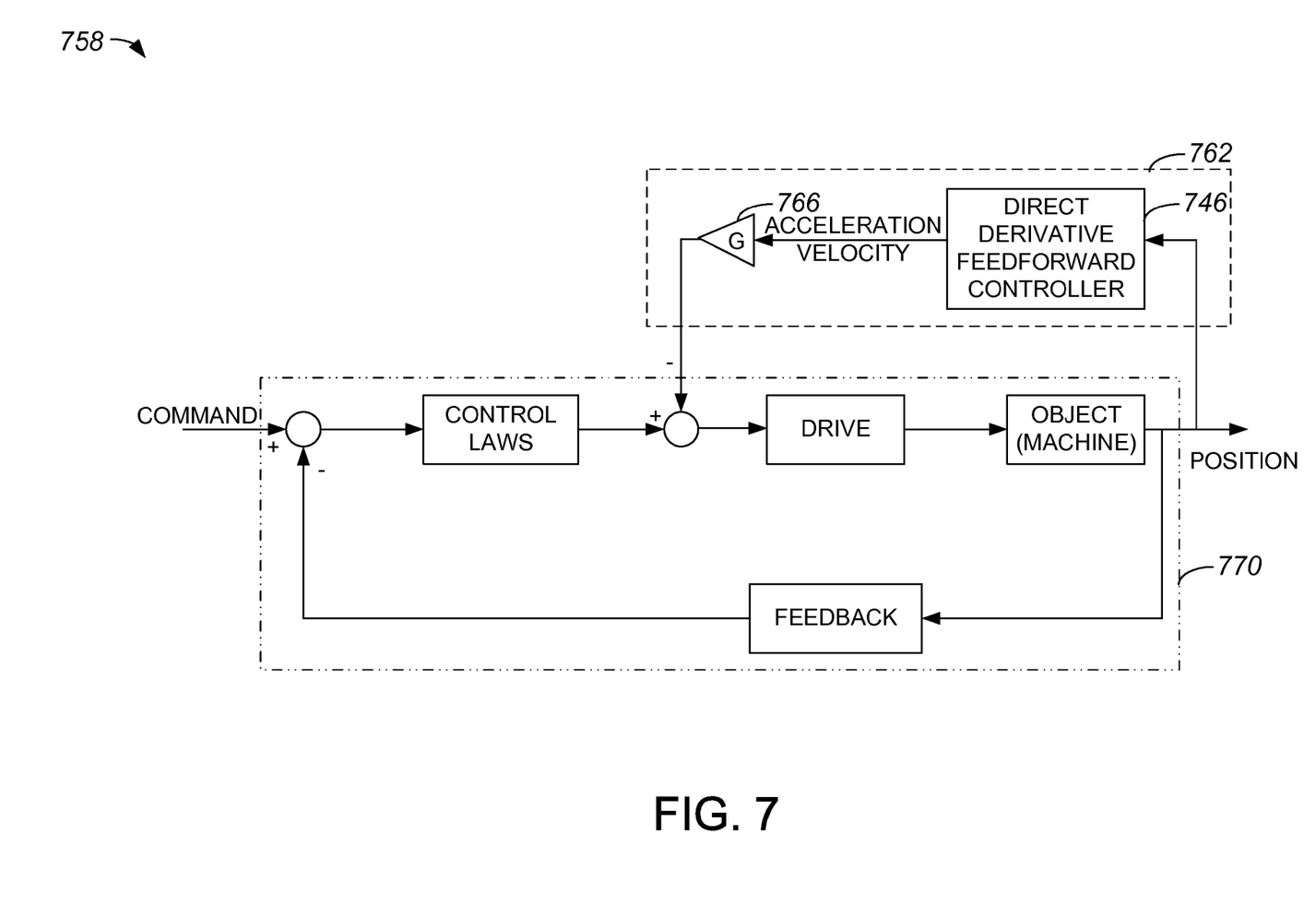
FIG. 7 is a representation of a position control system that includes direct derivative feedforward vibration compensation system in accordance with an embodiment of the present invention.

FIG. 7 is a representation of a position control system that includes direct derivative feedforward vibration compensation system in accordance with an embodiment of the present invention. A position control system 758 includes a direct derivative feedforward control arrangement 762 and a position control arrangement 770 that is configured to control the position of an object. Direct derivative feedforward control arrangement 762 includes a direct derivative feedforward controller 746 which takes position measurements as input. Direct derivative feedforward controller 746 may be similar to overall derivative control arrangement 646 of FIG. 6A. Using position measurements, direct derivative feedforward controller 746 may derive velocities and accelerations. Feedforward gains 766 may be applied to the derived velocities and accelerations to effectively create a feedforward signal. The feedforward signal is provided to the position control arrangement 770 after feedforward gains are applied. In one embodiment, feedforward gains may be predictive feedforward gains.

As shown, direct derivative feedforward control arrangement 762 does not directly use a command signal, e.g., a fixed target position or a desired moving trajectory which may be user-specified, to generate a feedforward signal. Rather, direct derivative feedforward control arrangement 762 uses position measurements relating to the actual position of an object to derive velocities and accelerations of the object and, subsequently, to cause appropriate feedforward signals to be generated.

Figure 8:
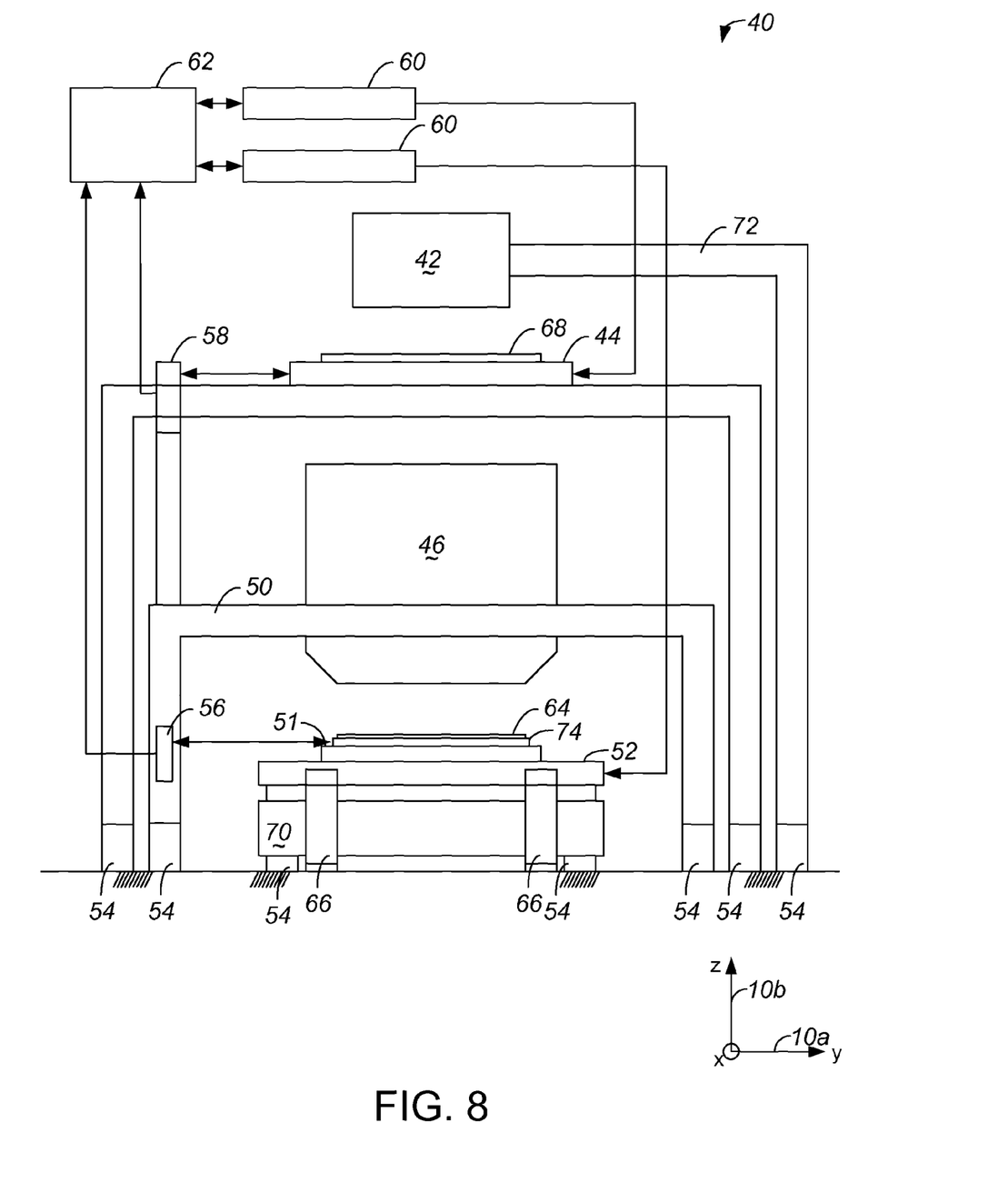
FIG. 8 is a diagrammatic representation of a photolithography apparatus in accordance with an embodiment of the present invention.

With reference to FIG. 8, a photolithography apparatus which may include a direct derivative feedforward vibration compensation system will be described in accordance with an embodiment of the present invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator. The planar motor which drives wafer positioning stage 52 generally uses an electromagnetic force generated by magnets and corresponding armature coils arranged in two dimensions.

A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, which may provide a beam of light that may be reflected off of a reticle. In one embodiment, illumination system 42 may be arranged to project a radiant energy, e.g., light, through a mask pattern on a reticle 68 that is supported by and scanned using a reticle stage 44 which may include a coarse stage and a fine stage, or which may be a single, monolithic stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays is preferably used. When either an F2-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Figure 9:
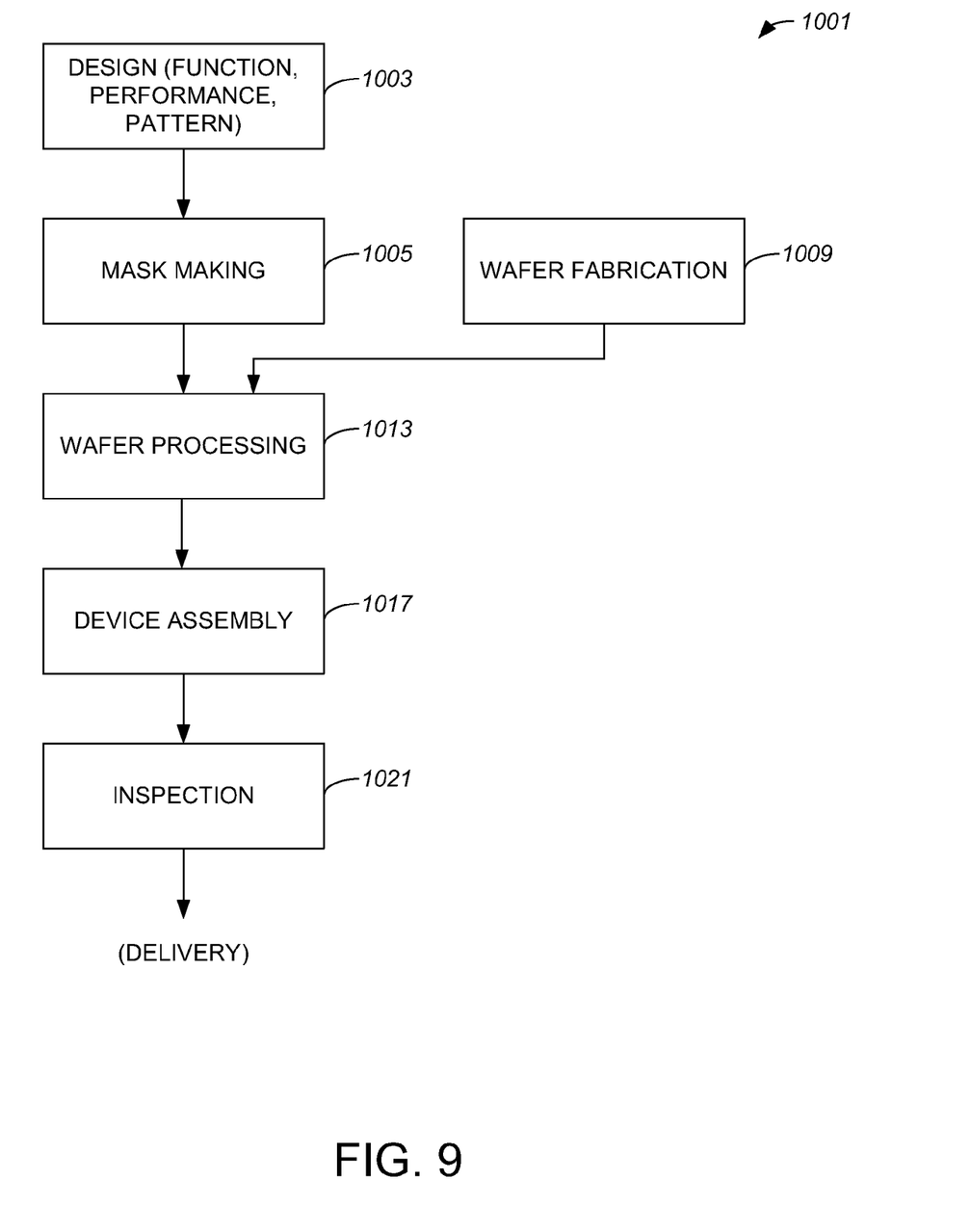
FIG. 9 is a process flow diagram which illustrates the steps associated with fabricating a semiconductor device in accordance with an embodiment of the present invention.

Further, semiconductor devices may be fabricated using systems described above, as will be discussed with reference to FIG. 9. FIG. 9 is a process flow diagram which illustrates the steps associated with fabricating a semiconductor device in accordance with an embodiment of the present invention. A process 1001 of fabricating a semiconductor device begins at step 1003 in which the function and performance characteristics of a semiconductor device are designed or otherwise determined. Next, in step 1005, a reticle or mask in which has a pattern is designed based upon the design of the semiconductor device. It should be appreciated that in a substantially parallel step 1009, a wafer is typically made from a silicon material. In step 1013, the mask pattern designed in step 1005 is exposed onto the wafer fabricated in step 1009. One process of exposing a mask pattern onto a wafer will be described below with respect to FIG. 10. In step 1017, the semiconductor device is assembled. The assembly of the semiconductor device generally includes, but is not limited to including, wafer dicing processes, bonding processes, and packaging processes. Finally, the completed device is inspected in step 1021. Upon successful completion of the inspection in step 1021, the completed device may be considered to be ready for delivery.

Figure 10:
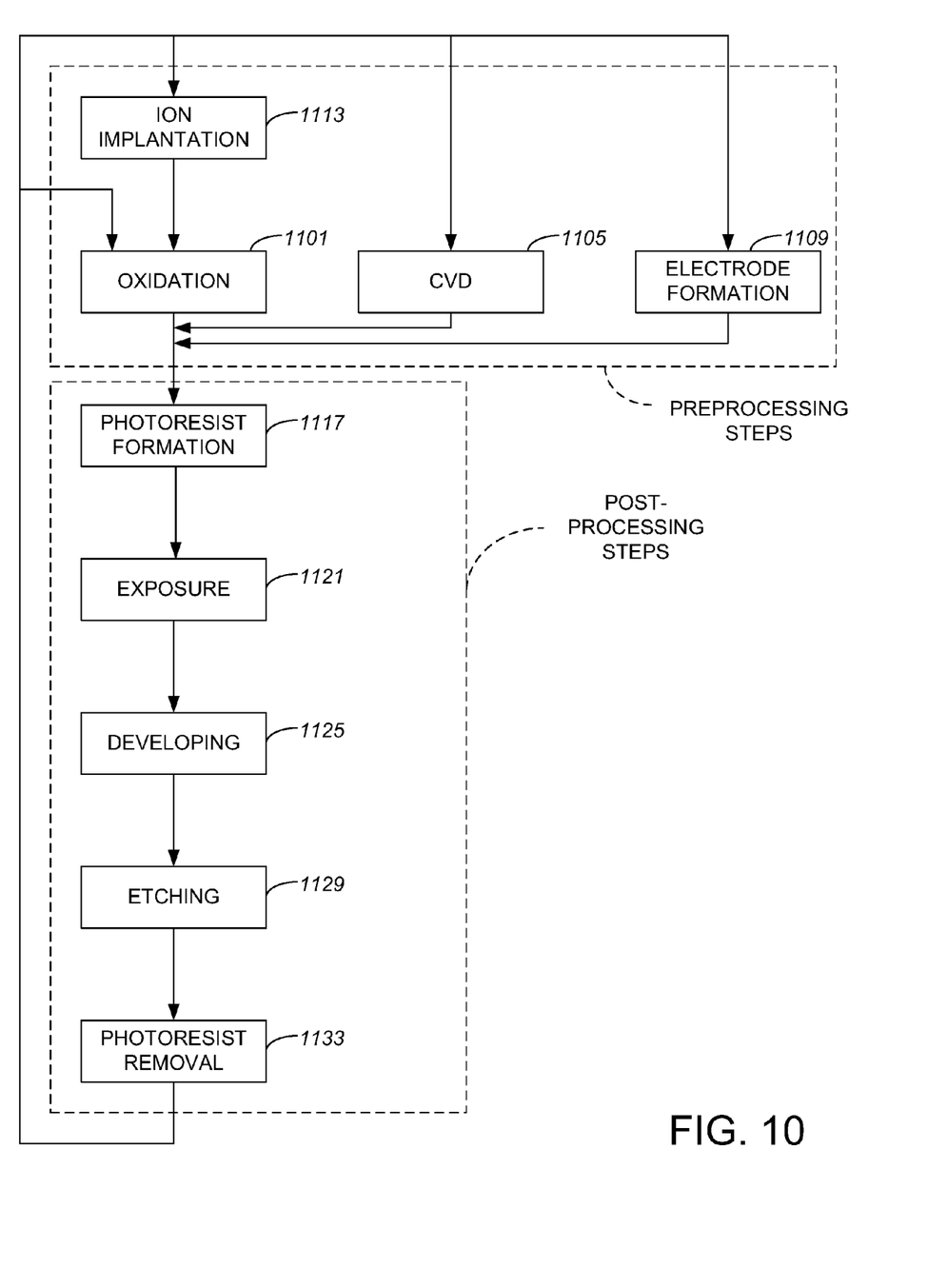
FIG. 10 is a process flow diagram which illustrates the steps associated with processing a wafer, i.e., step 1104 of FIG. 9, in accordance with an embodiment of the present invention.

FIG. 10 is a process flow diagram which illustrates the steps associated with wafer processing in the case of fabricating semiconductor devices in accordance with an embodiment of the present invention. In step 1101, the surface of a wafer is oxidized. Then, in step 1105 which is a chemical vapor deposition (CVD) step in one embodiment, an insulation film may be formed on the wafer surface. Once the insulation film is formed, then in step 1109, electrodes are formed on the wafer by vapor deposition. Then, ions may be implanted in the wafer using substantially any suitable method in step 1113. As will be appreciated by those skilled in the art, steps 1101-1113 are generally considered to be preprocessing steps for wafers during wafer processing. Further, it should be understood that selections made in each step, e.g., the concentration of various chemicals to use in forming an insulation film in step 1105, may be made based upon processing requirements.

At each stage of wafer processing, when preprocessing steps have been completed, post-processing steps may be implemented. During post-processing, initially, in step 1117, photoresist is applied to a wafer. Then, in step 1121, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1125. Once the exposed wafer is developed, parts other than residual photoresist, e.g., the exposed material surface, may be removed by etching in step 1129. Finally, in step 1133, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, the use of direct derivative feedforward controllers may be used to compensate for vibrations associated with a projection lens arrangement. It should be appreciated, however, that such controllers are not limited to being used to effectively dampen vibrations associated with a projection lens arrangement. Substantially any vibrations including, but not limited to including, vibrations associated with a wafer or reticle stage may also be compensated for using direct derivative feedforward controllers.

Multiple position sensors may be used to measure the position of an object or element such as a projection lens. That is, a position sensor arrangement may include a plurality of position sensors that measure positions of an object relative to different axes. In one embodiment, an acceleration and velocity determination arrangement may be configured to determine accelerations and velocities relative to multiple axes, i.e., degrees of freedom, and a vibration compensation arrangement may be arranged to determine forces to apply relative to the multiple axes in order to compensate for vibrations on the object.

The embodiments of the present invention may be implemented as hardware and/or software logic embodied in a tangible medium that, when executed, is operable to perform the various methods and processes described above. That is, the logic may be embodied as physical arrangements or components, or as software logic. For example, derivative controllers that derive or otherwise construct velocities and accelerations based on position measurements may be implemented as include hardware logic, software logic, or a combination of both hardware and software logic. The tangible medium may be substantially any computer-readable medium that is capable of storing logic which may be executed, e.g., by a computing system, to perform methods and functions associated with the embodiments of the present invention.

The operations associated with the various methods of the present invention may vary widely. By way of example, steps may be added, removed, altered, combined, and reordered without departing from the spirit or the scope of the present invention.

The many features of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method of compensating for vibrations of an object, the method comprising:
    obtaining a plurality of position measurements associated with the object;
    processing the plurality of position measurements to determine a derivative acceleration, wherein processing the plurality of position measurements to determine the derivative acceleration includes deriving at least one velocity from the plurality of position measurements and deriving the derivative acceleration from the at least one velocity;
    determining a compensatory force to counteract the vibrations of the object, wherein determining the compensatory force includes using the derivative acceleration; and
    applying the compensatory force to the object, wherein the deriving the at least one velocity is performed by a first derivative controller and deriving the derivative acceleration is performed by a second derivative controller.

2. The method of claim 1 wherein the first derivative controller and the second derivative controllers are limited bandwidth derivative controllers, and wherein the first derivative controller and the second derivative controller have a cut-off frequency.

3. The method of claim 2 wherein the cut-off frequency is approximately 100 Hertz (Hz).

4. The method of claim 1 wherein determining the compensatory force further includes using the at least one derivative velocity.

5. The method of claim 1 wherein the object is a lens of a projection lens system, and obtaining the plurality of position measurements includes obtaining the plurality of position measurements using a position sensor.

6. An exposure apparatus comprising the projection lens system of claim 5.

7. A wafer formed using the exposure apparatus of claim 6.

8. An apparatus for compensating for vibrations of an object, the apparatus comprising:
    a position sensing arrangement, the position sensing arrangement being configured to measure at least a first position of the object at a first time, a second position of the object at a second time, and a third position of the object at a third time;
    a derivative control arrangement, the derivative control arrangement being configured to derive at least a first derivative velocity using the first position, the second position and the third position, the derivative control arrangement further being configured to derive at least a first derivative acceleration using at least the first derivative velocity; and
    a compensation arrangement, the compensation arrangement being arranged to determine a compensation force to compensate for the vibrations of the object using at least the first derivative acceleration, wherein the compensation arrangement is still further arranged to cause the compensation force to be applied to the object.

9. The apparatus of claim 8 wherein the compensation arrangement is still further arranged to determine the compensation force using the first derivative velocity.

10. The apparatus of claim 8 wherein the derivative control arrangement is arranged to obtain a position measurement signal from the position sensing arrangement that includes the first position, the second position, and the third position.

11. The apparatus of claim 8 wherein the derivative control arrangement includes a limited bandwidth derivative controller with a cut-off frequency.

12. The apparatus of claim 11 wherein the cut-off frequency is greater than a peak frequency associated with the object.

13. The apparatus of claim 8 wherein the object is a projection lens of an exposure apparatus.

14. A wafer formed using the exposure apparatus of claim 13.

15. An apparatus of comprising:
    an object, the object being subjected to vibrations;
    a driver, the driver being configured to apply a force to the object;
    a position sensing arrangement, the position sensing arrangement being configured to measure positions of the object at different times, the positions of the object including a first position, a second position, and a third position; and
    a control arrangement, the control arrangement being arranged to determine the force to be applied to the object to compensate for the vibrations, wherein the control arrangement is arranged to determine the force by processing the positions, and wherein the control arrangement includes a first derivative controller and a second derivative controller, the first derivative controller being arranged to construct at least a first velocity of the object using the positions, the second derivative controller being arrange to construct at least a first acceleration of the object using at least the first velocity.

16. The apparatus of claim 15 wherein the control arrangement is arranged to determine the force using at least the first acceleration.

17. The apparatus of claim 16 wherein the control arrangement is further arranged to determine the force using at least the first velocity.

18. The apparatus of claim 15 wherein the apparatus is an exposure apparatus.

19. The apparatus of claim 18 wherein the object is a projection lens.

20. A wafer formed using the exposure apparatus of claim 18.

\* \* \* \* \*